United States Patent
Kusunoki et al.

(10) Patent No.: US 7,915,467 B2
(45) Date of Patent: Mar. 29, 2011

(54) SEMICONDUCTOR WAFER AND SEMICONDUCTOR DEVICE

(75) Inventors: Junya Kusunoki, Tokyo (JP); Takashi Hirano, Tokyo (JP)

(73) Assignee: Sumitomo Bakelite Company, Ltd., Tokyo (JP)

( * ) Notice: Subject to any disclaimer, the term of this patent is extended or adjusted under 35 U.S.C. 154(b) by 517 days.

(21) Appl. No.: 11/665,543

(22) PCT Filed: Oct. 20, 2005

(86) PCT No.: PCT/JP2005/019275
§ 371 (c)(1),
(2), (4) Date: Apr. 17, 2007

(87) PCT Pub. No.: WO2006/043617
PCT Pub. Date: Apr. 27, 2006

(65) Prior Publication Data
US 2008/0090176 A1     Apr. 17, 2008

(30) Foreign Application Priority Data
Oct. 20, 2004 (JP) .................................. 2004-306116

(51) Int. Cl.
*C07C 1/00* (2006.01)
(52) U.S. Cl. .......... 585/326; 257/40; 257/618; 585/329; 585/362; 438/460
(58) Field of Classification Search .................... 257/40, 257/618; 585/326, 329, 362; 438/460
See application file for complete search history.

(56) References Cited

U.S. PATENT DOCUMENTS

| | | | |
|---|---|---|---|
| 4,339,521 A | 7/1982 | Ahne et al. | |
| 2004/0039153 A1* | 2/2004 | Elce et al. | 528/403 |
| 2004/0219452 A1* | 11/2004 | Rhodes et al. | 430/270.1 |
| 2006/0041093 A1* | 2/2006 | Ravikiran et al. | 526/282 |

FOREIGN PATENT DOCUMENTS

| | | |
|---|---|---|
| EP | 1 801 872 A1 | 6/2007 |
| JP | 1-46862 | 10/1989 |
| JP | 07-221128 | 8/1995 |
| JP | 11-271973 | 10/1999 |
| JP | 2003-209104 | 7/2003 |
| JP | 2003-268188 | 9/2003 |
| JP | 2004-285129 | 10/2004 |
| WO | 98/59004 | 12/1998 |

OTHER PUBLICATIONS

Bai et al, "Photosensitive Polynorbornene Based Dielectric. I. Structure-Property Relationships," Journal of Applied Polymer Science, vol. 91, 2004, pp. 3023-3030.*
European Search Report dated Aug. 2, 2010.
Japanese Office Action mailed on Jan. 18, 2011 for Application No. 2006-543052 with English translation.

* cited by examiner

*Primary Examiner* — Kenneth A Parker
*Assistant Examiner* — Anthony Ho
(74) *Attorney, Agent, or Firm* — Smith, Gambrell & Russell, LLP

(57) ABSTRACT

Disclosed is a semiconductor wafer which is characterized in that a resin layer composed of a resin composition containing a cyclic olefin resin (A) having an epoxy group and a photoacid generator (B) is arranged on a surface on which a circuit element is formed, and the residual stress of the resin layer after curing is 1-20 MPa. Also disclosed is a semiconductor device comprising such a semiconductor wafer.

9 Claims, 1 Drawing Sheet

[Figure 1]
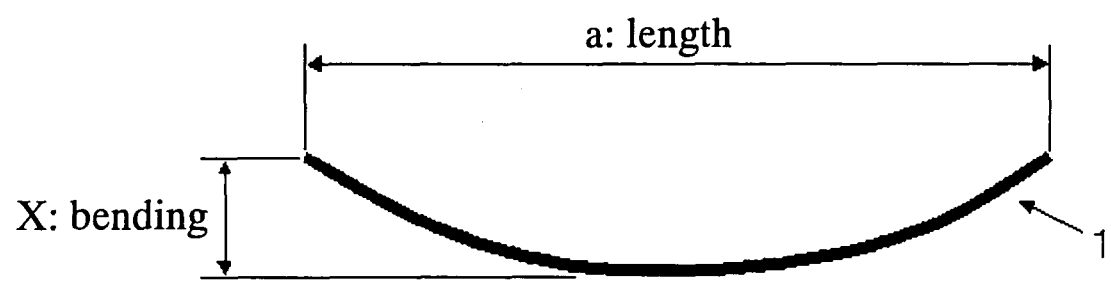

SEMICONDUCTOR WAFER AND SEMICONDUCTOR DEVICE

TECHNICAL FIELD

The present invention relates to a semiconductor wafer using a resin composition which is excellent in low stress properties and adhesion or the like, and to a semiconductor device produced using the semiconductor wafer.

BACKGROUND ART

A polyimide resin having excellent heat resistance, electrical properties, mechanical properties or the like has been used for a surface protective film and interlayer insulating film of a semiconductor element. However, improvement of properties such as thermal cycle resistance and thermal shock resistance has been required due to high integration and growth in size of the semiconductor element, thickness reduction and miniaturization of an encapsulation resin package, and shift to surface mounting by solder reflow in recent years, and a polyimide resin having higher performance has been required.

On the other hand, attention has been focused on a technique for imparting photosensitivity to the polyimide resin itself. Examples of photosensitive polyimide resins include one represented by the following formula (8).

encapsulation resin becomes important. Since these mainly act as a permanent protective film for interlayer insulation, and exist between the circuit element and the encapsulation resin, poor adhesion of the photosensitive resin and encapsulation resin causes a problem in the generation of peelings at the interface, resulting in a lack of practicality.

In recent years, growth in size and thickness reduction of a wafer has been particularly advanced, and 300 mm wafers have been used. When a conventional photosensitive resin is used, bending is often generated in the large wafers, and there exists a problem in that wafers are broken in a process for grinding a backside of the wafers to make them thinner. Therefore, means for solving such problems has been required.

Patent Document 1: Japanese Patent Publication No. 1-46862 B

DISCLOSURE OF THE INVENTION

Problems to be Solved

The present invention provides a semiconductor wafer using a cyclic olefin resin composition excellent in low stress and adhesion properties, which has low residual stress resulting in suppression of breakage of the semiconductor wafer in a process for grinding the backside of the semiconductor wafer to make them thinner and which has low residual stress.

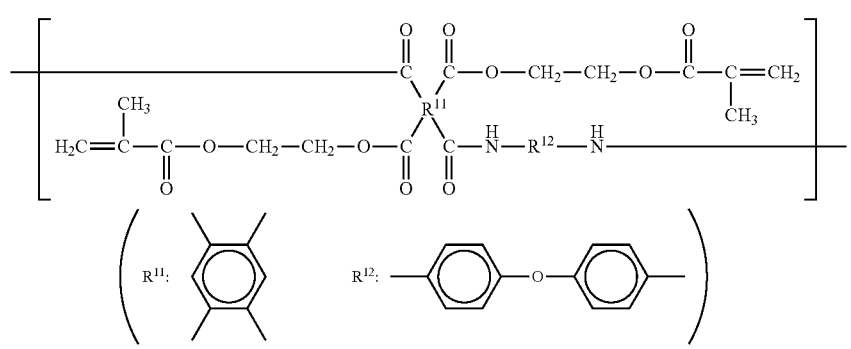

[Formula 1]

The use thereof allows simplification of a part of a pattern producing process, resulting in shortening the process. However, since solvents such as N-methyl-2-pyrrolidone are required for the development, there are problems in safety and handling. Consequently, a positive photosensitive resin developable in an alkaline water solution has been recently developed. For example, a positive photosensitive resin composed of a polybenzoxazole precursor and a diazoquinone compound has been disclosed (for example, see patent document 1). This has high heat resistance, excellent electrical properties and fine processability, and has a possibility not only as a resin for wafer coat but also as a resin for interlayer insulation. Referring to the development mechanism of this positive photosensitive resin, the diazoquinone compound of a non-exposure part is insoluble in the alkaline water solution. The chemical reaction of the diazoquinone compound is caused by exposure, and thereby the diazoquinone compound becomes soluble in the alkaline water solution. The coat pattern of only the non-exposure part can be produced by using a difference between solubility in the exposure part and that in the non-exposure part.

When these photosensitive resins are actually used for products, the adhesion between the photosensitive resin and Also, the present invention provides a highly reliable semiconductor device produced using the semiconductor wafer.

Measures for Solving the Problems

The present inventors have made extensive investigations into means of suppression of wafer breakage in a process for thinning the wafer, when preparing wafers having larger diameter and more reduced thickness. As a result, the present inventors have found that the bending of a wafer causing a wafer breakage arises from a large difference in thermal expansion coefficient between an Si wafer and a photosensitive resin, and a wafer breakage in thinning the wafer can be suppressed by controlling the residual stress of the resin composition. Consequently, the present invention has been completed.

The present invention provides a semiconductor wafer in which a wafer breakage occurring in a process for thinning a wafer is suppressed. Furthermore, the present invention provides a thin semiconductor device using the suppressed semiconductor wafer and a semiconductor chip prepared by dicing the semiconductor wafer, and having high reliability.

That is, according to an aspect of the present invention, there is provided a semiconductor wafer comprising a resin layer composed of a resin composition comprising a cyclic olefin resin (A) having an epoxy group and a photoacid generator (B), wherein the resin layer is formed on a circuit element forming surface, and the residual stress of the resin layer after curing is 1 to 20 MPa.

In an aspect of the present invention, the cyclic olefin resin may be a polynorbornene resin. For example, the cyclic olefin resin having an epoxy group containing a repeating unit represented by the formula (1):

[Formula 2]

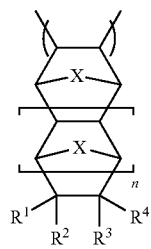

(1)

wherein X is O, $CH_2$ or $(CH_2)_2$; n is an integer of 0 to 5; $R^1$ to $R^4$ are each independently selected from a hydrogen atom, an alkyl group, an alkenyl group, an alkynyl group, an aryl group, an aralkyl group, a functional group containing an ester group, a functional group containing a ketone group, a functional group containing an ether group, and a functional group containing an epoxy group; $R^1$ to $R^4$ may be different in a repetition of a monomer; and at least one of $R^1$ to $R^4$ in all the repeating units is the functional group having an epoxy group, may be used as the cyclic olefin resin.

In another aspect of the present invention, the cyclic olefin resin (A) having an epoxy group may be a cyclic olefin resin containing repeating units represented by the formulae (2) and (3):

[Formula 3]

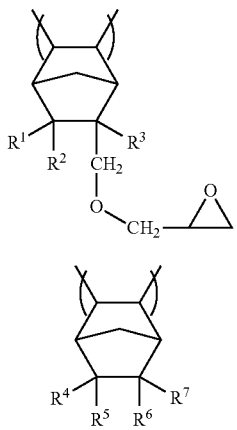

(2)

(3)

wherein $R^1$ to $R^7$ are each independently selected from a hydrogen atom, an alkyl group, an alkenyl group, an alkynyl group, an aryl group, an aralkyl group, a functional group containing an ester group, a functional group containing a ketone group, and a functional group containing an ether group; and $R^1$ to $R^7$ may be different in a repetition of a monomer.

In another aspect of the present invention, the cyclic olefin resin (A) having an epoxy group may be a cyclic olefin resin containing repeating units represented by the formulae (4), (5) and (6):

[Formula 4]

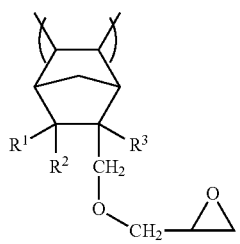

(4)

(5)

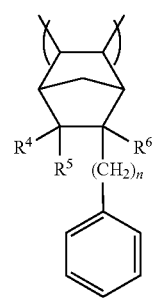

(6)

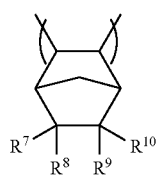

wherein n is an integer of 0 to 5; $R^1$ to $R^{10}$ are each independently selected from a hydrogen atom, an alkyl group, an alkenyl group, an alkynyl group, an aryl group, an aralkyl group, a functional group containing an ester group, a functional group containing a ketone group, and a functional group containing an ether group; and $R^1$ to $R^{10}$ may be different in a repetition of a monomer.

In another aspect of the present invention, the cyclic olefin resin (A) having an epoxy group may be a cyclic olefin resin containing a repeating unit represented by the formula (7):

[Formula 5]

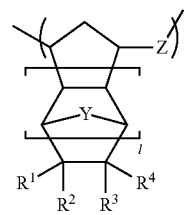

(7)

wherein Y is O, $CH_2$ or $(CH_2)_2$; Z is $-CH_2-CH_2$ or $-CH=CH-$; l is an integer of 0 to 5; $R^1$ to $R^4$ are each independently selected from a hydrogen atom, an alkyl group, an alkenyl group, an alkynyl group, an aryl group, an aralkyl group, a functional group containing an ester group, a functional group containing a ketone group, a functional group containing an ether group, and a functional group containing an epoxy group; $R^1$ to $R^4$ may be different in a repetition of a monomer; and at least one of $R^1$ to $R^4$ in all the repeating units has the epoxy group.

In the present invention, the thickness of the semiconductor wafer is not particularly limited. However, in an aspect of the present invention, the thickness of the semiconductor wafer is, for example, 10 to 200 μm, preferably 20 to 150 μm and more preferably 30 to 100 μm.

According to another aspect of the present invention, there is provided a semiconductor chip prepared by dicing the semiconductor wafer.

According to another aspect of the present invention, there is also provided a semiconductor device prepared using the semiconductor chip.

Effects of the Invention

The present invention can provide a semiconductor wafer using the cyclic olefin resin composition excellent in low stress properties and adhesion or the like in which the wafer breakage in a process for thinning the semiconductor wafer is suppressed and which has low residual stress. The present invention can also provide a semiconductor device using the semiconductor wafer.

BRIEF DESCRIPTION OF THE DRAWINGS

FIG. 1 shows a portion used for calculating curvature radius.

DESCRIPTION OF THE SYMBOLS

1 A wafer having a surface on which a resin layer is formed

BEST MODE FOR CARRYING OUT THE INVENTION

A semiconductor wafer of the present invention comprises a resin layer composed of a resin composition comprising a cyclic olefin resin (A) having an epoxy group and a photoacid generator (B), wherein the resin layer arranged on a surface on which a circuit element is formed, and the residual stress of the resin layer after curing being 1 to 20 MPa. The value exceeding 20 MPa causes the bending of a silicon wafer in a process for thinning the semiconductor wafer, which causes the breakage. The residual stress in the present invention is 1 to 20 MPa. For example, the residual stress is 1 to 15 MPa, and preferably 1 to 10 MPa. The residual stress can be calculated from the curvature radius.

General examples of cyclic olefin monomers used in the present invention include monocyclic compounds such as cyclohexene and cyclooctene, and polycyclic compounds such as norbornene, norbornadiene, dicyclopentadiene, dihydrodicyclopentadiene, tetracyclododecene, tricyclopentadiene, dihydrotricyclopentadiene, tetracyclopentadiene and dihydrotetracyclopentadiene. Substituted compounds prepared by introducing functional groups to these monomers can be also used.

Examples of the cyclic olefin resins used in the present invention include polymers of the above cyclic olefin monomers. As the polymerization method, there are used known methods such as random polymerization and block polymerization. Specific examples include (co)polymers of norbornene type monomers, copolymers of the norbornene type monomers and other monomers capable of being copolymerized such as α-olefins, and hydrogenated compounds of these copolymers. These cyclic olefin resins can be produced by the known polymerization methods, and the examples of the polymerization methods include an addition polymerization method and a ring-opening polymerization method. Of these, polymers prepared by addition-(co)polymerizing the norbornene monomers are preferable. However, the present invention is not limited thereto in any way.

Examples of the addition polymers of the cyclic olefin resins include polynorbornene type monomers, that is, (1) addition (co)polymers of norbornene type monomers prepared by addition-(co)polymerizing the norbornene type monomers, (2) addition copolymers of the norbornene type monomers and ethylene or α-olefins, and (3) addition copolymers of the norbornene type monomers, nonconjugated dienes and, as necessary, other monomers. These resins can be prepared by all the known polymerization methods.

Examples of the ring-opening polymers of the cyclic olefin resins include a polynorbornene resin. Specific examples thereof include (4) ring-opening (co)polymers of the norbornene type monomers and resins prepared by hydrogenating the (co)polymer as necessary; (5) ring-opening copolymers of the norbornene type monomer and ethylene or α-olefins, and resins prepared by hydrogenating the (co)polymer as necessary; and (6) ring-opening copolymers of the norbornene type monomer and nonconjugated diene or other monomers, and resins prepared by hydrogenating the (co) polymer as necessary. These resins can be prepared by all the known polymerization methods.

Of these, (1) the addition (co)polymers prepared by addition-(co)polymerizing the norbornene type monomers are preferable. However, the present invention is not limited thereto in any way.

Although the cyclic olefin resin (A) having an epoxy group used in the present invention can be generally prepared by directly polymerizing monomers containing the epoxy group in a molecule, the same polymer can be also prepared by a method for introducing an epoxy group into a side chain by modification reaction after the polymerization. Examples of the modification reactions include known methods such as a method for subjecting an unsaturated monomer containing an epoxy group to graft reaction with the above polymer, a method for reacting a reactive functional moiety of the above polymer with a compound having an epoxy group, and a method for directly epoxidizing the above polymer having a carbon-carbon double bond in a molecule using an epoxidizing agent such as peracid and hydroperoxide.

The addition polymer of the cyclic olefin resin is prepared by coordination polymerization or radical polymerization due to a metal catalyst. Of these, in the coordination polymerization, a polymer is prepared by polymerizing monomers in a solution in the presence of a transition metal catalyst (NiCOLE R. GROVE et al. Journal of Polymer Science: part B, Polymer Physics, Vol. 37, 3003 to 3010 (1999)).

Typical nickel and platinum catalysts as the metal catalysts used for the coordination polymerization are disclosed in PCT WO 97/33198 and PCT WO 00/20472. Examples of the metal catalysts for coordination polymerization include known metal catalysts such as (toluene)bis(perfluorophenyl)nickel, (mesitylene)bis(perfluorophenyl)nickel, (benzene)bis(perfluorophenyl)nickel, bis(tetrahydro)bis(perfluorophenyl)nickel, bis(ethylacetate)bis(perfluorophenyl)nickel, and bis(dioxane)bis(perfluorophenyl)nickel.

Radical polymerization techniques are disclosed in Encyclopedia of Polymer Science, John Wiley & Sons, 13, 708 (1988).

In the radical polymerization, monomers are generally reacted in a solution by raising the temperature of the solution to 50° C. to 150° C. in the presence of a radical initiator. Examples of the radical initiators include azobis(isobutyronitrile) (AIBN), benzoyl peroxide, lauryl peroxide, azobis(kaptronitrile), azobis(isoleronitrile) and t-butyl hydrogen peroxide.

The ring-opening polymer of the cyclic olefin resin is prepared by ring-opening (co)polymerizing at least one kind of norbornene type monomer using a titanium and tungsten compounds as a catalyst by known ring-opening polymerization methods to produce a ring-opening (co)polymer, followed by hydrogenating the carbon-carbon double bond in the ring-opening (co)polymer by a usual hydrogenating method as necessary to produce a thermoplastic saturated norbornene resin.

Suitable polymerization solvents for the above polymerization system include hydrocarbon solvents and aromatic solvents. Examples of the hydrocarbon solvents include, but are not limited to, pentane, hexane, heptane and cyclohexane. Examples of the aromatic solvents, but are not limited to, benzene, toluene, xylene and mesitylene. Diethyl ether, tetrahydrofuran, ethyl acetate, esters, lactones, ketones and amides can be also used. These solvents may be used singly or in admixture as the polymerization solvent.

The molecular weight of the cyclic olefin resin of the present invention can be controlled by changing a ratio of an initiator and monomer or changing polymerization time. When the above metal catalyst for coordination polymerization is used, the molecular weight can be controlled by using a chain transfer catalyst as disclosed in U.S. Pat. No. 6,136,499. In the present invention, α-olefins such as ethylene, propylene, 1-hexane, 1-decene and 4-methyl-1-pentene are suitable for controlling the molecular weight.

In the present invention, the weight average molecular weight is 10,000 to 500,000, preferably 30,000 to 100,000, and more preferably 50,000 to 80,000. The weight average molecular weight can be measured by gel permeation chromatography (GPC) using polynorbornene as a standard (in reference to ASTMDS3536-91).

As the cyclic olefin monomer used for producing the cyclic olefin resin having an epoxy group used in the present invention, the norbornene type monomer represented by the formula (9) is preferable,

[Formula 6]

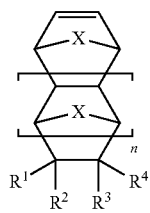

(9)

wherein X is O, $CH_2$ or $(CH_2)_2$; n is an integer of 0 to 5; $R^1$ to $R^4$ are each independently selected from a hydrogen atom, an alkyl group, an alkenyl group, an alkynyl group, an aryl group, an aralkyl group, a functional group containing an ester group, a functional group containing a ketone group, a functional group containing an ether group, and a functional group containing an epoxy group.

Specific examples of the alkyl groups include methyl, ethyl, propyl, isopropyl, butyl, pentyl, hexyl, heptyl, octyl, nonyl, decyl, dodecyl, cyclopentyl, cyclohexyl and cyclooctyl groups. Examples of the alkenyl groups include vinyl, allyl, butynyl and cyclohexyl groups. Examples of the alkynyl groups include ethynyl, 1-propynyl, 2-propynyl, 1-butynyl and 2-butynyl groups. Examples of the aryl groups include phenyl, naphthyl and anthracenyl groups. Examples of the aralkyl groups include benzyl and phenethyl groups. However, the present invention is not limited thereto in any way.

Referring to the functional group containing the ester group, the functional group containing the ketone group and the functional group containing the ether group, as long as the functional groups have these groups, the structure thereof is not particularly limited. Preferable examples of the functional groups containing the epoxy group include a functional group having a glycidyl ether group. However, as long as the functional group has the epoxy group, the structure thereof is not particularly limited.

Examples of the cyclic olefin monomers used for producing the cyclic olefin resin used in the present invention include 5-methyl-2-norbornene, 5-ethyl-2-norbornene, 5-propyl-2-norbornene, 5-butyl-2-norbornene, 5-pentyl-2-norbornene, 5-hexyl-2-norbornene, 5-heptyl-2-norbornene, 5-octyl-2-norbornene, 5-nonyl-2-norbornene and 5-decyl-2-norbornene as the monomer having an alkyl group; 5-allyl-2-norbornene, 5-methylidene-2-norbornene, 5-ethylidene-2-norbornene, 5-isopropylidene-2-norbornene, 5-(2-propenyl)-2-norbornene, 5-(3-butenyl)-2-norbornene, 5-(1-methyl-2-propenyl)-2-norbornene, 5-(4-pentenyl)-2-norbornene, 5-(1-methyl-3-butenyl)-2-norbornene, 5-(5-hexenyl)-2-norbornene, 5-(1-methyl-4-pentenyl)-2-norbornene, 5-(2,3-dimethyl-3-butenyl)-2-norbornene, 5-(2-ethyl-3-butenyl)-2-norbornene, 5-(3,4-dimethyl-4-pentenyl)-2-norbornene, 5-(7-octenyl)-2-norbornene, 5-(2-methyl-6-heptenyl)-2-norbornene, 5-(1,2-dimethyl-5-hexenyl)-2-norbornene, 5-(5-ethyl-5-hexenyl)-2-norbornene, and 5-(1,2,3-trimethyl-4-pentenyl)-2-norbornene; as the monomer having an alkenyl group; 5-ethynyl-2-norbornene as the monomer having an alkynyl group; 1,1,3,3,5,5-hexamethyl-1,5-dimethylbis(2-(5-norbornene-2-yl)ethyl)trisiloxane as the monomer having a silyl group; 5-phenyl-2-norbornene, 5-naphthyl-2-norbornene, 5-pentafluorophenyl-2-norbornene as the monomer having an aryl group; 5-benzyl-2-norbornene, 5-phenethyl-2-norbornene, 5-pentafluorophenylmethyl-2-norbornene, 5-(2-pentafluorophenylethyl)-2-norbornene, 5-(3-pentafluorophenylpropyl)-2-norbornene as the monomer having an aralkyl group; dimethylbis((5-norbornene-2-yl)methoxy)silane, 5-trimethoxysilyl-2-norbornene, 5-triethoxysilyl-2-norbornene, 5-(2-trimethoxysilylethyl)-2-norbornene, 5-(2-triethoxysilylethyl)-2-norbornene, 5-(3-trimethoxysilylpropyl)-2-norbornene, 5-(4-trimethoxybutyl)-2-norbornene, and 5-trimethylsilylmethylether-2-norbornene as the monomer having an alkoxysilyl group; 5-norbornene-2-methanol and its alkyl ether, 5-norbornene-2-methyl acetate, 5-norbornene-2-methyl propionate, 5-norbornene-2-methyl butyrate, 5-norbornene-2-methyl valerate, 5-norbornene-2-methyl caproate, 5-norbornene-2-methyl caprylate, 5-norbornene-2-methyl caprate, 5-norbornene-2-methyl laurate, 5-norbornene-2-methyl stearate, 5-norbornene-2-methyl oleate, 5-norbornene-2-methyl linolenate, 5-norbornene-2-carboxylic acid, methyl 5-norbornene-2-carboxylate, ethyl 5-norbornene-2-carboxylate, t-butyl 5-norbornene-2-carboxylate, i-butyl 5-norbornene-2-carboxylate, trimethylsilyl 5-norbornene-2-carboxylate, triethylsilyl 5-norbornene-2-carboxylate, isobornyl 5-norbornene-2-carboxylate, 2-hydroxyethyl 5-norbornene-2-carboxylate, methyl 5-norbornene-2- methyl-2-carboxylate, 5-norbornene-2-methyl cinnamate, 5-norbornene-2-methyl ethyl carbonate, 5-norbornene-2-methyl n-butyl carbonate, 5-norbornene-2-methyl t-butyl carbonate, 5-methoxy-2-norbornene, 5-norbornene-2-methyl (meth)acrylate, 5-norbornene-2-ethyl (meth)acrylate, 5-norbornene-2-n-butyl (meth)acrylate, 5-norbornene-2-n-propyl (meth)acrylate, 5-norbornene-2-i-butyl (meth)acrylate, 5-norbornene-2-i-propyl (meth)acrylate, 5-norbornene-2-hexyl (meth)acrylate, 5-norbornene-2-octyl (meth)acrylate, and 5-norbornene-2-decyl (meth)acrylate; as the monomer having a hydroxyl group, an ether group, a carboxyl group, an ester group, an acrylyl group or a methacryloyl group; 5-[(2,3-epoxypropoxy)methyl]-2-norbornene as the monomer having an epoxy group; 8-methoxycarbonyltetracyclo[4.4.0.1$^{2,5}$.1$^{7,10}$]dodec-3-ene, 8-ethoxycarbonyltetracyclo[4.4.0.1$^{2,5}$.1$^{7,10}$]dodec-3-ene, 8-n-propylcarbonyltetracyclo[4.4.0.1$^{2,5}$.1$^{7,10}$]dodec-3-ene, 8-i-propylcarbonyltetracyclo[4.4.0.1$^{2,5}$.1$^{7,10}$]dodec-3-ene, 8-n-butoxycarbonyltetracyclo[4.4.0.1$^{2,5}$.1$^{7,10}$]dodec-3-ene, 8-(2-methylpropoxy)carbonyltetracyclo[4.4.0.1$^{2,5}$.1$^{7,10}$]dodec-3-ene, 8-(1-methylpropoxy)carbonyltetracyclo[4.4.0.1$^{2,5}$.1$^{7,10}$]dodec-3-ene, 8-t-butoxycarbonyltetracyclo[4.4.0.1$^{2,5}$.1$^{7,10}$]dodec-3-ene, 8-cyclohexyloxycarbonyltetracyclo[4.4.0.1$^{2,5}$.1$^{7,10}$]dodec-3-ene, 8-(4'-t-butylcyclohexyloxy)carbonyltetracyclo[4.4.0.1$^{2,5}$.1$^{7,10}$]dodec-3-ene, 8-phenoxycarbonyltetracyclo[4.4.0.1$^{2,5}$.1$^{7,10}$]dodec-3-ene, 8-tetrahydrofuranyloxycarbonyltetracyclo[4.4.0.1$^{2,5}$.1$^{7,10}$]-3-dodecene, 8-tetrahydropyranyloxycarbonyltetracyclo[4.4.0.1$^{2,5}$.1$^{7,10}$]dodec-3-ene, 8-methyl-8-methoxycarbonyltetracyclo[4.4.0.1$^{2,5}$.1$^{7,10}$]dodec-3-ene, 8-methyl-8-ethoxycarbonyltetracyclo[4.4.0.1$^{2,5}$.1$^{7,10}$]dodec-3-ene, 8-methyl-8-n-propoxycarbonyltetracyclo[4.4.0.1$^{2,5}$.1$^{7,10}$]dodec-3-ene, 8-methyl-8-i-propoxycarbonyltetracyclo[4.4.0.1$^{2,5}$.1$^{7,10}$]dodec-3-ene, 8-methyl-8-n-butoxycarbonyltetracyclo[4.4.0.1$^{2,5}$.1$^{7,10}$]dodec-3-ene, 8-methyl-8-(2-methylpropoxy)carbonyltetracyclo[4.4.0.1$^{2,5}$.1$^{7,10}$]dodec-3-ene, 8-methyl-8-(1-methylpropoxy)carbonyltetracyclo[4.4.0.1$^{2,5}$.1$^{7,10}$]dodec-3-ene, 8-methyl-8-t-butoxycarbonyltetracyclo[4.4.0.1$^{2,5}$.1$^{7,10}$]dodec-3-ene, 8-methyl-8-cyclohexyloxycarbonyltetracyclo[4.4.0.1$^{2,5}$.1$^{7,10}$]dodec-3-ene, 8-methyl-8-(4'-t-butylcyclohexyloxy)carbonyltetracyclo[4.4.0.1$^{2,5}$.1$^{7,10}$]dodec-3-ene, 8-methyl-8-phenoxycarbonyltetracyclo[4.4.0.1$^{2,5}$.1$^{7,10}$]dodec-3-ene, 8-methyl-8-tetrahydrofuranyloxycarbonyltetracyclo[4.4.0.1$^{2,5}$.1$^{7,10}$]dodec-3-ene, 8-methyl-8-tetrahydropyranyloxycarbonyltetracyclo[4.4.0.1$^{2,5}$.1$^{7,10}$]-3-dodecene, 8-methyl-8-acetoxytetracyclo[4.4.0.1$^{2,5}$.1$^{7,10}$]dodec-3-ene, 8,9-di(methoxycarbonyl)tetracyclo[4.4.0.1$^{2,5}$.1$^{7,10}$]dodec-3-ene, 8,9-di(ethoxycarbonyl)tetracyclo[4.4.0.1$^{2,5}$.1$^{7,10}$]dodec-3-ene, 8,9-di(n-propoxycarbonyl)tetracyclo[4.4.0.1$^{2,5}$.1$^{7,10}$]dodec-3-ene, 8,9-di(i-propoxycarbonyl)tetracyclo[4.4.0.1$^{2,5}$.1$^{7,10}$]dodec-3-ene, 8,9-di(n-butoxycarbonyl)tetracyclo[4.4.0.1$^{2,5}$.1$^{7,10}$]dodec-3-ene, 8,9-di(t-butoxycarbonyl)tetracyclo[4.4.0.1$^{2,5}$.1$^{7,10}$]dodec-3-ene, 8,9-di(cyclohexyloxycarbonyl)tetracyclo[4.4.0.1$^{2,5}$.1$^{7,10}$]dodec-3-ene, 8,9-di(phenoxyloxycarbonyl)tetracyclo[4.4.0.1$^{2,5}$.1$^{7,10}$]dodec-3-ene, 8,9-di(tetrahydrofuranyloxycarbonyl)tetracyclo[4.4.0.1$^{2,5}$.1$^{7,10}$]-3-dodecene, 8,9-di(tetrahydropyranyloxycarbonyl)tetracyclo[4.4.0.1$^{2,5}$.1$^{7,10}$]-3-dodecene, 8,9-tetracyclo[4.4.0.1$^{2,5}$.1$^{7,10}$]dodec-3-ene, tetracyclo[4.4.0.1$^{2,5}$.1$^{7,10}$]dodec-3-ene-8-carboxylic acid, 8-methyltetracyclo[4.4.0.1$^{2,5}$.1$^{7,10}$]dodec-3-ene-8-carboxylic acid, 8-methyltetracyclo[4.4.0.1$^{2,5}$.1$^{7,10}$]dodec-3-ene, 8-ethyltetracyclo[4.4.0.1$^{2,5}$.1$^{7,10}$]dodec-3-ene, 8-methyltetracyclo[4.4.0.1$^{2,5}$.0$^{1,6}$]dodec-3-ene 8-ethylidenetetracyclo[4.4.0.1$^{2,5}$.1$^{7,12}$]dodec-3-ene, and 8-ethylidenetetracyclo[4.4.0.1$^{2,5}$.1$^{7,10}$0$^{1,6}$]dodec-3-ene as the monomer containing a tetracyclo ring.

The cyclic olefin resin (A) having an epoxy group used in the present invention is an addition (co)polymer of a norbornene type monomer represented by the formula (10):

[Formula 7]

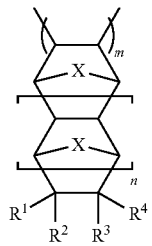

(10)

wherein X is O, $CH_2$ or $(CH_2)_2$; n is an integer of 0 to 5; m is an integer of 10 to 10,000; $R^1$ to $R^4$ are each independently selected from a hydrogen atom, an alkyl group, an alkenyl group, an alkynyl group, an aryl group, an aralkyl group, a functional group containing an ester group, a functional group containing a ketone group, a functional group containing an ether group, and a functional group containing an epoxy group; $R^1$ to $R^4$ may be different in a repetition of a monomer; and at least one of $R^1$ to $R^4$ in all the repeating units has the epoxy group.

As the cyclic olefin resin (A) having an epoxy group used in the present invention, polymers represented by the formulae (11) and (12) are preferable in view of the polymer characteristic after curing,

[Formula 8]

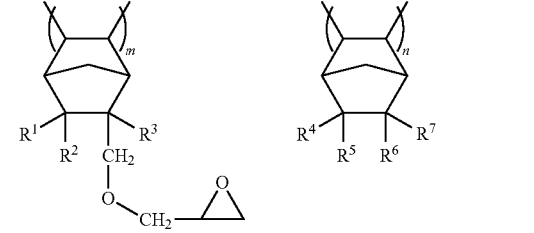

(11)

wherein m and n are each independently an integer of 1 or more; $R^1$ to $R^7$ are each independently selected from a hydrogen atom, an alkyl group, an alkenyl group, an alkynyl group, an aryl group, an aralkyl group, a functional group containing an ester group, a functional group containing a ketone group, and a functional group containing an ether group; and $R^1$ to $R^7$ may be different in a repetition of a monomer,

[Formula 9]

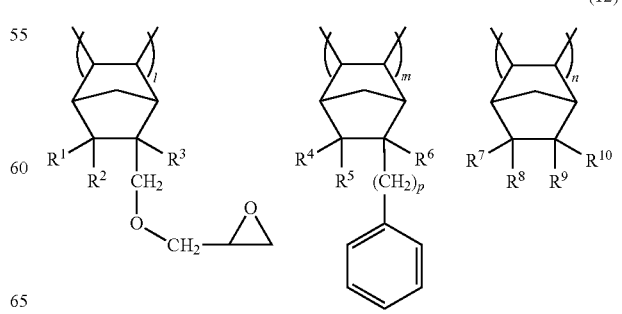

(12)

wherein l, m and n are each independently an integer of 1 or more; p is an integer of 0 to 5; $R^1$ to $R^{10}$ are each independently selected from a hydrogen atom, an alkyl group, an alkenyl group, an alkynyl group, an aryl group, an aralkyl group, a functional group containing an ester group, a functional group containing a ketone group, and a functional group containing an ether group; and $R^1$ to $R^{10}$ may be different in a repetition of a monomer. As shown in the formula (12), the solubility to polar solvents such as cyclopentanone and heptanone used as a solvent for a negative type developer can be enhanced by introducing the norbornene monomer having an aralkyl group into the polymer, and the introduction has such an advantage that the polymer has excellent operability.

As the cyclic olefin resin (A) having an epoxy group used in the present invention, a polymer represented by the formula (13) is more desirable in view of the polymer characteristic after curing,

[Formula 10]

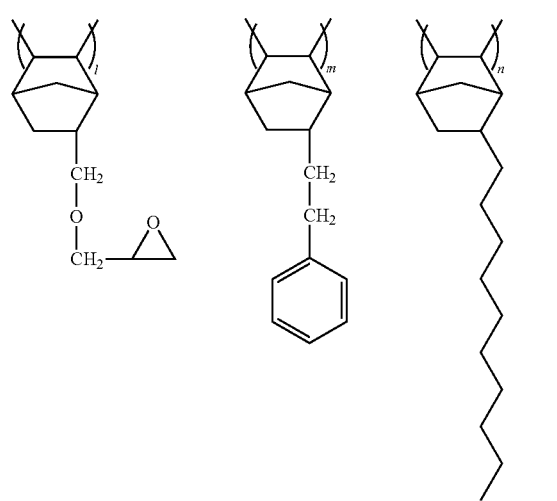

(13)

wherein l, m and n are each independently an integer of 1 or more. A film having low elastic modulus is obtained by introducing a monomer having a decyl group. Also, a film excellent in low water absorbency, chemical resistance and polar solvent solubility is obtained by introducing a monomer having a phenylethyl group.

The content of the monomer having an epoxy group in the copolymer can be determined based on that the copolymer is crosslinked by exposure and a crosslink density capable of enduring the developer is obtained. The monomer having an epoxy group can be used at a ratio of 5 to 95 mol %, preferably 20 to 80 mol %, and more preferably 30 to 70% in the polymer. The polymer thus obtained exhibits excellent physical characteristics such as low water absorbency (<0.3 wt %), low dielectric constant (<2.6), low dielectric loss (0.001), and glass transition temperature (170 to 400° C.).

All known compounds can be used as a photoacid generator. The photoacid generator crosslinks the epoxy group and increases adhesion to a substrate according to the subsequent curing. Preferable examples of the photoacid generators include onium salts, halogen compounds, sulfonates and the mixture thereof. Examples of the onium salts include diazonium salts, ammonium salts, iodonium salts, sulfonium salts, phosphonium salts, arsonium salts and oxonium salts. As long as a compound can produce counter anions with the above onium salts, the counter anions are not limited. Examples of the counter anions include, but are not limited to, boric acid, arsonium acid, phosphoric acid, antimonic acid, sulfonate, carboxylic acid and chloride thereof. As the photoacid generator of the onium salts, triphenylsulfonium tetrafluoroborate, triphenylsulfonium tetrafluoroborate, triphenylsulfonium tetrafluoroarsenate, triphenylsulfonium tetrafluorophosphate, triphenylsulfonium pentafluorosulfate, 4-thiophenoxydiphenylsulfonium tetrafluoroborate, 4-thiophenoxydiphenylsulfonium hexafluoroantimonate, 4-thiophenoxydiphenylsulfonium hexafluoroarsenate, 4-thiophenoxydiphenylsulfonium tetrafluorophosphate, 4-thiophenoxydiphenylsulfonium trifluorosulfonate, 4-t-butylphenyldiphenylsulfonium tetrafluoroborate, 4-t-butylphenyldiphenylsulfonium hexafluoroarsenate, 4-t-butylphenyldiphenylsulfonium hexafluoroantimonate, 4-t-butylphenyldiphenylsulfonium hexafluorophosphonate, 4-t-butylphenyldiphenylsulfonium trifluorosulfonate, tris(4-methylphenyl)sulfonium tetrafluoroborate, tris(4-methylphenyl)sulfonium tetrafluoroborate, tris(4-methylphenyl)sulfonium hexafluoroarsenate, tris(4-methylphenyl)sulfonium hexafluorophosphate, tris(4-methylphenyl)sulfonium hexafluorosulfonate, tris(4-methoxyphenyl)sulfonium tetrafluoroborate, tris(4-methylphenyl)sulfonium hexafluoroantimonate, tris(4-methylphenyl)sulfonium hexafluorophosphonate, tris(4-methylphenyl)sulfonium trifluorosulfonate, triphenyliodonium tetrafluoroborate, triphenyliodonium hexafluoroantimonate, triphenyliodonium hexafluoroarsenate, triphenyliodonium hexafluorophosphonate, triphenyliodonium trifluorosulfonate, 3,3-dinitrodiphenyliodonium tetrafluoroborate, 3,3-dinitrodiphenyliodonium hexafluoroantimonate, 3,3-dinitrodiphenyliodonium hexafluoroarsenate, 3,3-dinitrodiphenyliodonium trifluorosulfonate, 4,4-dinitrodiphenyliodonium tetrafluoroborate, 4,4-dinitrodiphenyliodonium hexafluoroantimonate, 4,4-dinitrodiphenyliodonium hexafluoroarsenate, and 4,4-dinitrodiphenyliodonium trifluorosulfonate may be used singly or in admixture.

Examples of the photoacid generators containing halogen other than fluoride include 2,4,6-tris(trichloromethyl)triazine, 2-allyl-4,6-bis(trichloromethyl)triazine, α,β,α-tribromomethylphenylsulfone, α,α,2,3,5,6-hexachloroxylene, 2,2-bis(3,5-dibromo-4-hydroxyphenyl)-1,1,1,3,3,3-hexafluoroxylene, 1,1,1-tris(3,5-dibromo-4-hydroxyphenyl)ethane, and the mixture thereof.

Examples of sulfonate photoacid generators include, but are not limited to, 2-nitrobenzyl tosylate, 2,6-dinitrobenzyl tosylate, 2,4-dinitrobenzyl tosylate, 2-nitrobenzylmethyl sulfonate, 2-nitrobenzyl acetate, 9,10-dimethoxy anthracene-2-sulfonate, 1,2,3-tris(methane sulfonyloxy)benzene, 1,2,3-tris (ethane sulfonyloxy)benzene, and 1,2,3-tris(propane sulfonyloxy)benzene.

Preferable examples of the photoacid generators include 4,4'-di-t-butylphenyl iodonium triflate, 4,4',4"-tris(t-butylphenyl)sulphonium triflate; diphenyliodonium tetrakis (pentafluorophenyl)borate; triphenysulfoniumdiphenyiodonium tetrakis(pentafluorophenyl)borate; 4,4'-di-t-butylphenyliodonium tetrakis(pentafluorophenyl)borate; tris (t-butylphenyl)sulphonium tetrakis(pentafluorophenyl) borate, (4-methylphenyl-4-(1-methylethyl)phenyliodonium tetrakis(pentafluorophenyl)borate, and the mixture thereof.

The mixed proportion of the photoacid generator in the present invention is 0.1 to 100 parts by weight relative to 100 parts by weight of the cyclic olefin resin, and more preferably 0.1 to 10 parts by weight.

A sensitizer can be used for the cyclic olefin resin composition of the present invention for higher photosensitivity as necessary. The sensitizer can extend a wavelength range capable of activating the photoacid generator, and can be added in a range which has no direct influence on the cross-linking reaction of the polymer. The optimal sensitizer has the maximum light absorption coefficient near the used light source and can pass the absorbed energy to the photoacid generator efficiently. Examples of the sensitizers for the photoacid generator include polycyclic aromatic compounds such as anthracene, pyrene and parylene. Examples thereof include 2-isopropyl-9H-thioxanthen-9-ene, 4-isopropyl-9H-thioxanthen-9-one, 1-chloro-4-propoxythioxanthene, phenothiazine, and the mixture thereof. The mixed proportion of the photoacid generator in the present invention is 0.1 to 10 parts by weight relative to 100 parts by weight of the polymer, and more preferably 0.2 to 5 parts by weight. When the light source has a long wavelength such as a g line (436 nm) and an i line (365 nm), the sensitizer is effective for activating the photoacid generator.

The resolution can be enhanced by adding small quantity of acid scavenger as necessary into the cyclic olefin resin composition used in the present invention. The acid scavenger absorbs acids diffused to a non light-exposed portion during the photochemical reaction. Examples of the acid scavengers include, but are not limited to, a second and third amines such as pyridine, lutidine, phenothiazine, tri-n-propyl amine and triethyl amine. The mixed proportion of the acid scavenger is 0.10 to 0.05 part by weight relative to 100 parts by weight of the polymer.

Additive agents, such as a leveling agent, an antioxidant, a fire retardant, a plasticizer, a silane coupling agent and a filler can be added as necessary into the resin composition used in the present invention and containing the cyclic olefin resin (A) having an epoxy group and the photoacid generator (B).

In the presents invention, these components are dissolved in a solvent and used in a varnish state. Examples of the solvents include non-reactive and reactive solvents. The non-reactive solvent acts as the career of the polymer or additive, and is removed in the processes of the coating and curing. The reactive solvent contains a reactive group having a compatibility with the curing agent added into the resin composition. Examples of non-reactive solvents include hydrocarbon solvents and aromatic solvents. Examples of the hydrocarbon solvents include, but are not limited to, alkane and cycloalkane such as pentane, hexane, heptane, cyclohexane and decahydronaphthalene. Examples of the aromatic solvents include benzene, toluene, xylene and mesitylene. Diethyl ether, tetrahydrofuran, anisole, acetate, ester, lactone, ketone and amide are also useful. As the reactive solvents, cyclo ether compounds such as cyclohexene oxide and α-pinene oxide, aromatic cycloethers such as [methylenebis(4,1-phenyleneoxymethylene)]bis oxirane, alicyclic vinyl ether compounds such as 1,4-cyclohexanedimethanoldivinyl ether, and aromatic compounds such as bis(4-vinylphenyl) methane may be used singly or in admixture. The reactive solvent is preferably mesitylene and decahydronaphthalene. They are optimal for coating resins on substrates made of silicon, silicon oxide, silicon nitride and silicon oxynitride or the like.

The resin solid content of the resin composition used for the present invention is 5 to 60% by weight. The resin solid content is more preferably 30 to 55% by weight, and still more preferably 35 to 45% by weight. The viscosity of the solution is 10 to 25,000 cP, and preferably 100 to 3,000 cP.

The resin composition used for the present invention is prepared by simply mixing the cyclic norbornene resin having an epoxy group, the photoacid generator, and as necessary, the solvent, the sensitizer, the acid scavenger, the leveling agent, the antioxidant, the fire retardant, the plasticizer, the silane coupling agent and the filler or the like.

Next, the semiconductor wafer and manufacturing method of the semiconductor device of the present invention will be described. First, a cyclic olefin resin composition is coated on a silicon wafer. As the method for coating, there are spin coating using a spinner, spray coating using a spray coater, immersion, printing, and roll coating or the like. Then, prebaking is conducted at 90 to 140° C. to dry the coating film, after which an actinic ray is applied in a desired pattern. As the actinic ray, there can be used an X-ray, an electron beam, an ultraviolet light and a visible light or the like. However, the actinic ray having a wavelength of 200 to 700 nm is preferable.

Baking is conducted after the irradiation of the actinic ray. This step increases the reaction velocity of epoxy cross-linkage. The baking conditions are set to 50 to 200° C. The baking conditions are preferably set to 80 to 150° C., and more preferably 90 to 130° C.

Then, the non-actinic ray-applied portion is dissolved and removed with a developer to obtain a relief pattern. Examples of the developers include hydrocarbon solvents such as alkane and cycloalkane, e.g., pentane, hexane, heptane and cyclohexane, and aromatic solvents such as toluene, mesitylene, xylene and mesitylene. There can be used terpenes such as limonene, dipentene, pinene and menthane and ketones such as cyclopentanone, cyclohexanone and 2-heptanone. There can be suitably used organic solvents prepared by adding an appropriate amount of a surfactant thereto.

As the method for development, a means such as spraying, paddle, immersion and ultrasonic wave or the like is usable. Then, the relief pattern formed by development is rinsed. As the rinsing liquid, alcohol is used. Then, a heat treatment is applied at 50 to 200° C. to remove the developer and the rinsing liquid, and the curing of the epoxy group is completed to obtain a final pattern having high heat resistance.

Then, the thinning process of the patterned wafer is carried out by grinding the backside of the wafer. Furthermore, the wafer is cut into individual pieces by dicing to obtain a semiconductor chip. The semiconductor chip and the lead frame are adhered and fixed by heating adhesion, and are electrically connected with each other by a gold wire. Then, the semiconductor chip is sealed using an epoxy encapsulation resin to produce a semiconductor device. As the encapsulation method, there can be used methods such as a transfer mold, a compression mold and an injection mold.

EXAMPLES

The present invention is specifically described below by way of Examples.

Example 1

This example illustrates a copolymer (A-1) of 5-decyl-2-norbornene (hereinafter, referred to as "decyl norbornene")/5-[(2,3-epoxypropoxy)methyl]-2-norbornene (hereinafter, referred to as "glycidyl methyl ether norbornene")=70/30.

All glassware was dried at 60° C. under a 0.1 torr vacuum for 18 hours. The glassware was then transferred into a glovebox and attached thereto. After ethyl acetate (917 g), cyclohexane (917 g), decyl norbornene (192 g, 0.82 mol), and glycidyl methyl ether norbornene (62 g, 0.35 mol) were added into a reaction flask, the reaction flask was taken out from the glovebox, and dry nitrogen gas was introduced into the reaction flask.

The reaction medium was degassed by passing a stream of nitrogen gas through the solution for 30 minutes. Inside the glovebox, a nickel catalyst, i.e., bis(toluene)bis(perfluorophenyl) nickel (9.36 g, 19.5 mmol), was dissolved in 15 ml of toluene, and taken up in a 25 mL syringe. The syringe was taken out from the glovebox and the solution was added into the reaction flask. The reaction was completed after stirring of the solution at 20° C. for 5 hours. Next, a peracetic acid solution (975 mmoL) was added, and the solution was stirred for 18 hours. Stirring was stopped and water and solvent layers were allowed to separate. The water layer was removed and 1 liter of distilled water was added. The solution was stirred for 20 minutes. The water layer was permitted to separate and was removed. Further, the wash with 1 liter of distilled water was performed total 3 times. The reaction mixture containing polymer was then poured into methanol. After the resulting precipitate was collected by filtration, washed sufficiently with water, and dried under vacuum. 243 g of dry polymer (96% conversion) was obtained after drying. The resulting polymer had a molecular weight by GPC Mw=115,366 Mn=47,000, Mw/Mn=2.43. Polymer composition by $^1$H-NMR 70 mole % decyl norbornene: 30 mole % glycidyl methyl ether norbornene.

After 228 g of the synthesized polymer (A-1) was dissolved in of 342 g of decahydronaphthalene, 4-methylphenyl-4-(1-methylethyl) phenyliodonium tetrakis(pentafluorophenyl)-borate (0.2757 g, 2.71×10$^{-4}$ mol), 1-chloro-4-propoxy-9H-thioxanthone (0.826 g, 2.71×10$^{-4}$ mol), phenothiazine (0.054 g, 2.71×10$^{-4}$ mol), and 3,5-di-t-butyl-4-hydroxyhydrocinnamate (0.1378 g, 2.60×10$^{-4}$ mol) were added thereto to be dissolved. The resulting solution was filtered through a 0.2 μm fluoro-resin filter to obtain a cyclic olefin resin composition.

The produced cyclic olefin resin composition was coated on a silicon wafer (thickness: 725 μm) of 12 inches using a spin coater, followed by drying on a hot plate at 120° C. for 5 minutes to obtain a coating film having a thickness of about 10 μm. To this coating film was applied a light at 300 mJ/cm$^2$ through a reticle using an i-line stepper, NSR-4425i (manufactured by Nikon Corporation). The coating film was then heated in order to promote the cross-linking reaction of a light-exposed portion at 100° C. for 4 minutes by the hot plate.

Then, the resulting material was immersed in limonene for 60 seconds to dissolve and remove a non-light-exposed portion, and rinsed with isopropyl alcohol for 20 seconds. As a result, the formation of a pattern could be observed. The residual film ratio (film thickness after development/film thickness before development) was very high, 99.6%. In the remaining pattern, detailed pattern peeling was not observed at all, and excellent adhesion during the development could be observed. The pattern was then cured at 160° C. for 60 minutes, and the cross-linking reaction was completed. The elastic modulus of this cured film was 0.5 GPa, and the water absorption was 0.2%. Then, the bending of this wafer measured by a surface roughness meter (Surfcom1400 D-64 type, manufactured by Tokyo Seimitsu) was 30 μm.

Then, the backside of this wafer was ground to 50 μm. However, breaking and cracking or the like did not occur, and a thin wafer was obtained.

The stress applied to the wafer was small and the bending of the wafer also became small. The stress calculated from change of the curvature radius of the wafer before and after forming the cyclic olefin resin film was 5 MPa. The stress was calculated by the following formulae.

$$R = \frac{a^2 + 4X^2}{8X} \quad \text{[Equation 1]}$$

$$\text{stress} = \frac{D^2 E}{6Rt(1-v)} \quad \text{[Equation 2]}$$

R: curvature radius (mm)
X: bending of wafer (mm) (see FIG. 1)
a: length (mm) (see FIG. 1)
D: thickness of wafer (mm)
E: elastic modulus (MPa) of silicon
t: thickness of resin (mm)
v: Poisson's ratio (0.3)

The dicing of the thin wafer ground to 50 μm was conducted to obtain a semiconductor chip. This semiconductor chip was adhered on a lead frame using an adhesive (IBF-3021, manufactured by Sumitomo Bakelite Co., Ltd.), and was electrically connected by a gold wire. The semiconductor chip was sealed and formed by an epoxy resin sealant (EME-7730L, manufactured by Sumitomo Bakelite Co., Ltd.) to obtain a semiconductor device.

A solder reflow test was carried out using the above semiconductor device. In a constant temperature and humidity chamber in which temperature and humidity were respectively set to 85° C. and 85%, this semiconductor device was exposed to moisture for 72 hours. Then, solder reflow was carried out in the reflow condition of 240° C./10 seconds, and the generated number of the external crack of the semiconductor device was observed under a microscope (magnification ratio: 15 magnifications). Five samples were each subjected to the test to check for generation of cracks, and no crack was observed (i.e. number of samples generating any cracks was 0/5). As a result of mounting the semiconductor device after the above solder reflow test on an actual printed circuit board and confirming the operation as the semiconductor device, the normal operation of the semiconductor device was confirmed.

Chip Size: 8 mm×10 mm
Lead Frame: 14 mm×20 mm×2 mm copper frame

Example 2

The backside of the wafer produced in the same manner as in Example 1 and having a thickness of 725 μm was ground to 200 μm. However, breaking and cracking or the like did not occur, and a thin wafer was obtained. Then, the bending of this wafer measured by the surface roughness meter was 370 μm. The stress calculated was 5 MPa.

Example 3

A terpolymer (A-2) of decyl norbornene/glycidyl methyl ether norbornene/phenethyl norbornene=55/30/15 was obtained in the same manner as in Example 1 except that decyl norbornene (129 g, 0.55 mol) and glycidyl methyl ether norbornene (177 g, 0.30 mol) and 5-(2-phenylethyl)-2-norbornene (hereinafter, referred to as "phenethyl norbornene") (29.7 g, 0.15 mol) were used in place of decyl norbornene (192 g, 0.82 mol) and glycidyl methyl ether norbornene (62 g, 0.35 mol) of Example 1. The polymerization and the reprecipitation were carried out, and 309 g (yield: 92%) of a polymer after drying was collected. The polymer obtained had a molecular weight by GPC Mw=30000, Mn=68000, Mw/Mn=2.3. Polymer composition by H-NMR 54 mole % decyl norbornene; 31 mole % glycidyl methyl ether norbornene; and 15 mole % phenethyl norbornene.

Evaluation was made in the same manner as in Example 1. The solder reflow resistance test and the operation confirmation of the semiconductor device were carried out in the same manner as in Example 1. In the solder reflow resistance test, the generated number of the cracks was 0/5. As a result of carrying out the operation confirmation of the semiconductor device after the solder reflow resistance test, the normal operation of the semiconductor device was confirmed.

Example 4

This example illustrates an example of a ring-opening metathesis copolymer (A-3) of decyl norbornene and phenethyl norbornene copolymer.

All glassware was dried at 60° C. under a 0.1 torr vacuum for 18 hours. The glassware was then transferred into a glovebox of which internal oxygen concentration and humidity were respectively suppressed within 1%, and attached thereto. Toluene (917 g), cyclohexane (917 g), decyl norbornene (129 g, 0.55 mol) and phenethyl norbornene (29.7 g, 0.55 mol), and 1-hexene (368 g, 2.2 mol) were added into the reaction flask. The reaction flask was taken out from the glovebox, and dry nitrogen gas was introduced into the reaction flask. The solution of the reaction intermediates was degassed by passing a stream of nitrogen gas through the solution for 30 minutes. A solution (0.05 mol/L) of tungsten pentachloride in t-butyl alcohol/methanol (mole ratio: 0.35/0.3) was prepared in the glovebox. the solution (3.78 g) and a co-catalytic solution (0.634 g) in which triethyl aluminum (0.011 g) was dissolved in toluene (25 g) were added into the reaction flask. The reaction was completed after stirring of the solution at 20° C. for 5 hours.

Then, this solution was taken up in an autoclave, and RuHCl(CO)[P($C_5H_5$)$_3$]$_3$ (40.02 g) was added. Hydrogen was introduced until the internal pressure became 100 kg/cm$^2$, and the solution was heated and stirred at 165° C. for 3 hours. After the heating was completed, the solution was cooled to room temperature, and the reaction product was added to methanol (975 mmol). The deposited solid was isolated and dissolved in 1 liter of toluene. Furthermore, 1 liter of distilled water was added, and the solution was stirred for 18 hours. Stirring was stopped and water and solvent layers were allowed to separate. The water layer was removed and 1 liter of distilled water was added. The solution was stirred for 20 minutes. The water layer was permitted to separate and was removed. Further, the wash with 1 liter of distilled water was performed total 3 times. The reaction mixture containing polymer was then poured into methanol. The resulting precipitate was collected by filtration, washed sufficiently with water, and dried under vacuum. 320 g of dry polymer (85% conversion) was obtained after drying. The resulting polymer had a molecular weight by GPC Mw=22,000, Mn=9,600, Mw/Mn=2.3. Tg measured by DMA is 150° C. Polymer composition by $^1$H-NMR 48 mole % decyl norbornene: 52 mole % phenethyl norbornene.

After 50 parts by weight of the obtained polymer, 6 parts by weight of 5,6-epoxy-1-hexene and 1.5 parts by weight of dicumyl peroxide were dissolved in 120 parts by weight of cyclohexane and the resulting solution was reacted in the autoclave at 150° C. for 3 hours, the obtained reaction product solution was poured into 240 parts by weight of isopropyl alcohol to solidify the reaction product. The solidified epoxy-modified polymer was vacuum dried at 100° C. for 5 hours to obtain 50 weight parts of the epoxy-modified polymer. Tg of this epoxy-modified polymer measured by DMA is 15° C. The epoxy-modified polymer obtained had a molecular weight by GPC Mw=23,000, Mn=10,000, Mw/Mn=2.3. The epoxy modification ratio of this epoxy-modified polymer was 2%. Evaluation of the obtained epoxy-modified polymer was made in the same manner as in Example 1.

The solder reflow resistance test and the operation confirmation of the semiconductor device were carried out in the same manner as in Example 1. In the solder reflow resistance test, the generated number of the cracks was 0/5. As a result of carrying out the operation confirmation of the semiconductor device after the solder reflow resistance test, the normal operation of the semiconductor device was confirmed.

Comparative Example 1

Into a four-necked separable flask provided with a thermometer, a stirrer, a raw material inlet and a dry nitrogen gas-introducing tube were placed 4,4'-diaminodiphenylether (19.02 g, 95 mol %). Anhydrous N-methyl-2-pyrrolidone of only the amount in which the solid content rate in the total amount of raw materials becomes 15% by weight was added thereto and dissolved. Then, the flask was immersed in a water bath of 0 to 50° C., and 21.81 g (100 mol %) of the refined pyromellitic dianhydride was added while the generation of heat was suppressed. After the pyromellitic dianhydride was dissolved, the temperature of the system was kept at 20° C., and the reaction was continued for 10 hours. A polyimide precursor (B-1) obtained by reacting was coated on a silicon wafer (thickness: 725 μm) of 12 inches using a spin coater, followed by drying on a hot plate at 140° C. for 5 minutes to obtain a coating film having a thickness of about 14 μm.

Then, the coating film was cured at 350° C. for 60 minutes and cyclization reaction was completed to obtain a coating film of about 10 μm after curing. Evaluation was made in the same manner as in Examples 1 and 2.

Comparative Example 2

In Comparative Example 1, benzophenone tetracarboxylic acid dianhydride (32.2 g, 100 mol %) (B-2) was used in place of pyromellitic dianhydride, and the reaction was carried out by the same device and operation as Comparative Example 1.

The resin components and evaluation results of Examples 1 to 4 and Comparative Examples 1 to 2 are collectively shown in Table 1.

Since the elastic modulus and residual stress of the film after curing in Comparative Examples were high, the wafer was broken in grinding the backside thereof. Therefore, the solder reflow resistance test and the operation confirmation of the semiconductor device were not carried out.

[Formula 11]

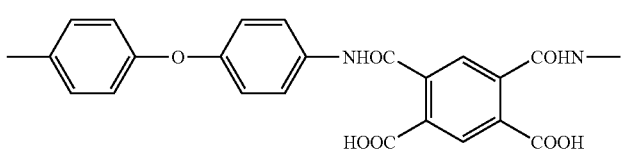

B-1

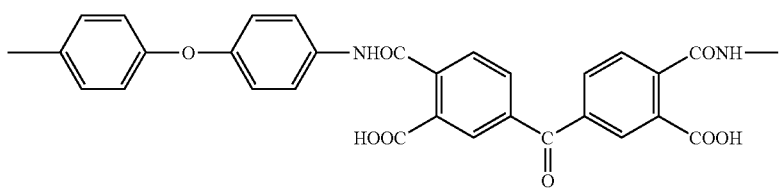

B-2

TABLE 1

| Resin | Elastic modulus (GPa) | Bending amount (μm) Wafer having a thickness of 725 μm | Bending amount (μm) Wafer having a thickness of 200 μm | Bending amount (μm) Wafer having a thickness of 50 μm | Residual stress (MPa) |
|---|---|---|---|---|---|
| Example 1 | A-1 | 0.5 | 30 | — | good | 5 |
| Example 2 | A-1 | 0.5 | — | 370 | — | 5 |
| Example 3 | A-2 | 0.9 | 45 | 600 | good | 9 |
| Example 4 | A-3 | 1.4 | 70 | 900 | good | 12 |
| Comparative Example 1 | B-1 | 2.6 | 170 | 2200 | generation of cracks | 30 |
| Comparative Example 2 | B-2 | 3.0 | 190 | 2500 | generation of cracks | 34 |

Industrial Applicability

Since the semiconductor wafer of the present invention uses the cyclic olefin resin composition which is excellent in low stress properties and adhesion or the like, and the residual stress of the resin layer after curing is low, the wafer breakage in polishing the backside of the wafer is not generated. The semiconductor wafer of the present invention is suitably used as the semiconductor chip produced from the wafer and the thin semiconductor device using the semiconductor chip.

What is claimed is:

1. A semiconductor wafer having a wafer and a resin layer composed of a resin composition comprising a cyclic olefin resin (A) having an epoxy group and a photoacid generator (B), wherein the resin layer is formed on a circuit element forming surface of the semiconductor wafer, and the residual stress of the resin layer after curing is 1 to 20 MPa, wherein the cyclic olefin resin (A) having an epoxy group contains a repeating unit represented by the formula (1):

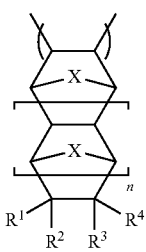

(1)

wherein X is O, $CH_2$ or $(CH_2)_2$; n is an integer of 0 to 5; $R^1$ to $R^4$ are each independently selected from a hydrogen atom, an alkyl group, an alkenyl group, an alkynyl group, an aryl group, an aralkyl group, a functional group containing an ester group, a functional group containing a ketone group, a functional group containing an ether group, and a functional group containing an epoxy group; $R^1$ to $R^4$ may be different in a repetition of a monomer; and at least one of $R^1$ to $R^4$ in all the repeating units is the functional group having an epoxy group, and wherein wafer thickness is 10 to 200 μm.

2. The semiconductor wafer according to claim 1, wherein the cyclic olefin resin (A) having an epoxy group is a copolymer that contains at least two repeating units represented by the formulae (2) and (3):

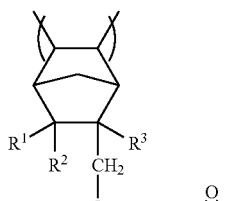

(2)

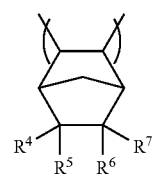

(3)

wherein $R^1$ to $R^7$ are each independently selected from a hydrogen atom, an alkyl group, an alkenyl group, an alkynyl group, an aryl group, an aralkyl group, a functional group containing an ester group, a functional group containing a ketone group, and a functional group containing an ether group; and $R^1$ to $R^7$ may be different in a repetition of a monomer.

3. The semiconductor wafer according to claim 1, wherein the cyclic olefin resin (A) having an epoxy group is a copolymer that contains at least three repeating units represented by the formulae (4), (5) and (6):

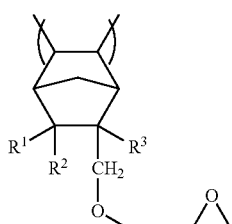

(4)

-continued (5)

$$\text{[structure with } R^4, R^5, R^6, (CH_2)_n \text{ and phenyl]}$$

(6)

$$\text{[structure with } R^7, R^8, R^9, R^{10}\text{]}$$

wherein n is an integer of 0 to 5; $R^1$ to $R^{10}$ are each independently selected from a hydrogen atom, an alkyl group, an alkenyl group, an alkynyl group, an aryl group, an aralkyl group, a functional group containing an ester group, a functional group containing a ketone group, and a functional group containing an ether group; and $R^1$ to $R^{10}$ may be different in a repetition of a monomer.

4. A semiconductor chip prepared by dicing the semiconductor wafer according to any one of claims 1, 2 and 3.

5. A semiconductor device prepared using the semiconductor chip according to claim 4.

6. A semiconductor wafer comprising a resin layer composed of a resin composition comprising a cyclic olefin resin (A) having an epoxy group and a photoacid generator (B),
wherein the resin layer is formed on a circuit element forming surface, and the residual stress of the resin layer after curing is 1 to 20 MPa,
wherein the cyclic olefin resin (A) having an epoxy group contains a repeating unit represented by the formula (1):

(1)

$$\text{[structure with X, } R^1, R^2, R^3, R^4\text{]}_n$$

wherein X is O, $CH_2$ or $(CH_2)_2$; n is an integer of 0 to 5; $R^1$ to $R^4$ are each independently selected from a hydrogen atom, an alkyl group, an alkenyl group, an alkynyl group, an aryl group, an aralkyl group, a functional group containing an ester group, a functional group containing a ketone group, a functional group containing an ether group, and a functional group containing an epoxy group; $R^1$ to $R^4$ may be different in a repetition of a monomer; and at least one of $R^1$ to $R^4$ in all the repeating units is the functional group having an epoxy group,
wherein the cyclic olefin resin (A) having an epoxy group is a copolymer that contains at least two repeating units represented by the formulae (2) and (3):

(2)

$$\text{[structure with } R^1, R^2, R^3, CH_2-O-CH_2-\text{epoxide]}$$

(3)

$$\text{[structure with } R^4, R^5, R^6, R^7\text{]}$$

wherein $R^1$ to $R^7$ are each independently selected from a hydrogen atom, an alkyl group, an alkenyl group, an alkynyl group, an aryl group, an aralkyl group, a functional group containing an ester group, a functional group containing a ketone group, and a functional group containing an ether group; and $R^1$ to $R^7$ may be different in a repetition of a monomer, and wherein the semiconductor wafer has a thickness of 10 to 200 μm.

7. A semiconductor wafer comprising a resin layer composed of a resin composition comprising a cyclic olefin resin (A) having an epoxy group and a photoacid generator (B),
wherein the resin layer is formed on a circuit element forming surface, and the residual stress of the resin layer after curing is 1 to 20 MPa,
wherein the cyclic olefin resin (A) having an epoxy group contains a repeating unit represented by the formula (1):

(1)

$$\text{[structure with X, } R^1, R^2, R^3, R^4\text{]}_n$$

wherein X is O, $CH_2$ or $(CH_2)_2$; n is an integer of 0 to 5; $R^1$ to $R^4$ are each independently selected from a hydrogen atom, an alkyl group, an alkenyl group, an alkynyl group, an aryl group, an aralkyl group, a functional group containing an ester group, a functional group containing a ketone group, a functional group containing an ether group, and a functional group containing an epoxy group; $R^1$ to $R^4$ may be different in a repetition of a monomer; and at least one of $R^1$ to $R^4$ in all the repeating units is the functional group having an epoxy group,
wherein the cyclic olefin resin (A) having an epoxy group is a copolymer that contains at least three repeating units represented by the formulae (4), (5) and (6):

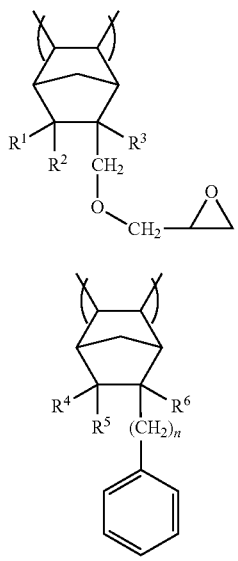
(4)

(5)

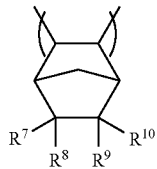
(6)

wherein n is an integer of 0 to 5; $R^1$ to $R^{10}$ are each independently selected from a hydrogen atom, an alkyl group, an alkenyl group, an alkynyl group, an aryl group, an aralkyl group, a functional group containing an ester group, a functional group containing a ketone group, and a functional group containing an ether group; and $R^1$ to $R^{10}$ may be different in a repetition of a monomer, and wherein the semiconductor wafer has a thickness of 10 to 200 μm.

8. A semiconductor chip prepared by dicing the semiconductor wafer according to claim 6 or 7.

9. A semiconductor device prepared using the semiconductor chip according to claim 8.

* * * * *